United States Patent
Wang et al.

(10) Patent No.: US 8,426,325 B2
(45) Date of Patent: Apr. 23, 2013

(54) METHOD FOR OBTAINING HIGH-QUALITY BOUNDARY FOR SEMICONDUCTOR DEVICES FABRICATED ON A PARTITIONED SUBSTRATE

(75) Inventors: Li Wang, Nanchang (CN); Fengyi Jiang, Nanchang (CN)

(73) Assignee: Lattice Power (Jiangxi) Corporation, Nanchang (CN)

( * ) Notice: Subject to any disclaimer, the term of this patent is extended or adjusted under 35 U.S.C. 154(b) by 18 days.

(21) Appl. No.: 13/177,412

(22) Filed: Jul. 6, 2011

(65) Prior Publication Data
US 2011/0281422 A1 Nov. 17, 2011

Related U.S. Application Data

(62) Division of application No. 11/776,881, filed on Jul. 12, 2007, now abandoned.

(30) Foreign Application Priority Data

Apr. 20, 2007 (CN) .......................... 2007 1 0104428

(51) Int. Cl.
*H01L 21/306* (2006.01)
(52) U.S. Cl.
USPC ............................................. 438/978; 438/48
(58) Field of Classification Search .................. 438/978, 438/48
See application file for complete search history.

(56) References Cited

U.S. PATENT DOCUMENTS

| | | | | |
|---|---|---|---|---|
| 4,680,085 A | * | 7/1987 | Vijan et al. | 438/482 |
| 5,357,125 A | * | 10/1994 | Kumagi | 257/133 |
| 5,406,095 A | * | 4/1995 | Koyama et al. | 257/88 |
| 5,489,787 A | * | 2/1996 | Amaratunga et al. | 257/137 |
| 6,001,678 A | * | 12/1999 | Takahashi | 438/238 |
| 6,156,584 A | * | 12/2000 | Itoh et al. | 438/33 |
| 6,294,414 B1 | * | 9/2001 | Levine | 438/183 |
| 6,539,039 B2 | * | 3/2003 | Furushima | 372/46.01 |
| 6,611,002 B2 | * | 8/2003 | Weeks et al. | 257/94 |
| 6,730,936 B2 | * | 5/2004 | Yukimoto | 257/88 |
| 6,730,990 B2 | * | 5/2004 | Kondo et al. | 257/623 |
| 7,030,032 B2 | * | 4/2006 | Marsh et al. | 438/745 |
| 7,060,518 B2 | * | 6/2006 | Kondo et al. | 438/47 |
| 7,282,379 B2 | * | 10/2007 | Goto et al. | 438/22 |
| 7,572,657 B2 | * | 8/2009 | Yakushiji | 438/33 |
| 2008/0087875 A1 | * | 4/2008 | Fan et al. | 257/13 |

* cited by examiner

*Primary Examiner* — Eugene Lee

(74) *Attorney, Agent, or Firm* — Shun Yao; Park, Vaughan, Fleming & Dowler LLP

(57) ABSTRACT

One embodiment of the present invention provides a process for obtaining high-quality boundaries for individual multilayer structures which are fabricated on a trench-partitioned substrate. During operation, the process receives a trench-partitioned substrate wherein the substrate surface is partitioned into arrays of isolated deposition platforms which are separated by arrays of trenches. The process then forms a multilayer structure, which comprises a first doped layer, an active layer, and a second doped layer, on one of the deposition platforms. Next, the process removes sidewalls of the multilayer structure.

10 Claims, 4 Drawing Sheets

METHOD FOR OBTAINING HIGH-QUALITY BOUNDARY FOR SEMICONDUCTOR DEVICES FABRICATED ON A PARTITIONED SUBSTRATE

RELATED APPLICATION

The present patent is a divisional of, and hereby claims priority under 35 U.S.C §120 to, pending U.S. patent application Ser. No. 11/776,881, entitled "Method for Obtaining High-Quality Boundary for Semiconductor Devices Fabricated on a Partitioned Substrate," by inventors Li Wang and Fengyi Jiang, filed on 12 Jul. 2007, which claims priority under 35 U.S.C. §119 to Chinese Patent Application No. 200710104428.0 entitled "Method for Obtaining High-Quality Boundary for Semiconductor Devices Fabricated on a Partitioned Substrate," by inventors Li Wang and Fengyi Jiang, filed on 20 Apr. 2007.

BACKGROUND

1. Field of the Invention

The present invention relates to techniques for semiconductor device manufacturing. More specifically, the present invention relates to a method for improving device qualities by etching sidewalls of semiconductor devices formed on isolated mesas of a partitioned substrate.

2. Related Art

Solid-state light-emitting devices are expected to lead the next wave of illumination technologies. High-brightness light-emitting diodes (HB-LEDs) are emerging in an increasing number of applications, from light source for display devices to light-bulb replacement for conventional lighting. Meanwhile, solid-state lasers continue to beam as the driving force in many critical technological fields, from optical data storage, to optical communication networks, and to medical applications.

In recent years, an increasing demand has emerged for short wavelength light-emitting devices, such as blue and UV LEDs and diode lasers. These short wavelength light-emitting devices are generally based on wide band-gap semiconductor materials, such as the nitride-based $In_xGa_yAl_{1-x-y}N$ ($0<=x<=1$, $0<=y<=1$) materials and zinc oxide-based $Zn_xMg_yCd_{1-x-y}O$ ($0<=x<=1$, $0<=y<=1$) materials, which both are under intense development worldwide. In particular, recent success in the development of nitride-based LEDs and lasers (e.g., GaN-based LEDs and lasers) not only extends the light-emission spectrum to the green, blue, and ultraviolet region, but also can achieve high light emission efficiency, low power consumption, and long operation lifetime.

GaN-based single-crystal substrates however are not commercially available in large quantities. Consequently, other substrate materials, such as silicon (Si), sapphire ($Al_2O_3$), gallium arsenide (GaAs), and silicon carbide (SiC), are often used as supporting substrates for epitaxial growth of GaN-based semiconductor devices. The heterogeneity between the substrate and the semiconductor devices causes inevitable lattice-constant and thermal-expansion coefficient mismatches. As a result, qualities of these nitride-based semiconductor devices, such as light emitting efficiency and reliability, can be significantly impacted by such mismatches. In particular, the above mismatches can result in high density of dislocations and large in-plane stresses in the epitaxial layers, which can subsequently lead to device quality deterioration and high probability of cracking of the multilayer structures.

A number of techniques have been introduced to effectively reduce the dislocation density due to the lattice-constant mismatch, for example, by using a buffer layer between the heterogeneous substrate and epitaxial semiconductor layers, or by using an epitaxial lateral overgrowth (ELOG) technique. However, these techniques still exhibit deficiencies in eliminating stresses caused by the above mismatches, and cracking in the epitaxial semiconductor layers continues to be a serious problem during fabrication.

A recently proposed technique can effectively reduce in-plane stresses by "partitioning" a large wafer into individual independent platforms. Note that "partitioning" the wafer is referred to the process of patterning and forming intersection trenches on the wafer surface without breaking the wafer. Typically, deep trenches are patterned and formed (e.g., by etching the substrate) on a flat substrate surface, which divide the substrate surface into isolated "islands" surrounded by trenches. Next, semiconductor multilayer structures are fabricated on the partitioned substrate, and individual devices are formed on isolated single-unit platforms. Because the stress force is proportional to surface area, the stress in each isolated device is significantly reduced and limited.

A problem arises from growing semiconductor multilayer structures on these individual deposition platforms. Each platform corresponds to a relatively confined area for film growth, and the boundaries of each platform can have deleterious effect on the multilayer structure near the boundary.

Hence, what is needed is a method and an apparatus that can obtain high-quality boundaries for multilayer semiconductor devices which are fabricated on isolated platforms without the above-described problems.

SUMMARY

One embodiment of the present invention provides a process for obtaining high-quality boundaries for individual multilayer structures which are fabricated on a trench-partitioned substrate. During operation, the process receives a trench-partitioned substrate wherein the substrate surface is partitioned into arrays of isolated deposition platforms which are separated by arrays of trenches. The process then forms a multilayer structure, which comprises a first doped layer, an active layer, and a second doped layer, on one of the deposition platforms. Next, the process removes sidewalls of the multilayer structure.

In a variation of this embodiment, the process removes the sidewalls of the multilayer structure by etching the sidewalls using a dry etching process, a wet etching process, or a combined dry etching and wet etching process.

In a further variation of this embodiment, prior to etching the sidewalls, the process protects non-boundary surface of the multilayer structure with a mask layer, thereby only exposing the boundary region of the multilayer structure to the subsequent etching process.

In a further variation, the exposed boundary width is between 2 μm and 50 μm.

In a further variation, if a dry etching process is used, the process controls the dry etching process to at least etch through the active layer of the multilayer structure, wherein the dry etching process is directed perpendicular to the multilayer structure.

In a further variation, the dry etching process is an inductively coupled plasma (ICP) etching.

In a further variation, the wet etching process uses a $H_3PO_4$ based etchant.

In a further variation, the $H_3PO_4$ based etchant is heated to a temperature greater than 100° C.

In a further variation, the process performs the etching process from the underside of the multiple structures by: (1)

bonding a supporting structure to the topside of the multiple structures; (2) removing the trench-partitioned substrate to expose the underside of the multiple structures, wherein the multilayer structures are attached to the supporting structure; (3) patterning the underside of the multiple structures to expose undesirable boundary regions of the multiple structures; and (4) removing the sidewalls of the multiple structures corresponding to the undesirable boundary region.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the present invention. Thus, the present invention is not limited to the embodiments shown, but is to be accorded the widest scope consistent with the claims.

Partitioning a Substrate for Stress Release

When using a conventional semiconductor wafer, such as a silicon (Si) wafer, as a substrate to fabricate heterogeneous multilayer semiconductor structures, such as a GaN blue LED, stress in the multilayer structures arises from lattice-constant and thermal-expansion-coefficient mismatch between the substrate surface and the multilayer structures. Such stress typically increases with the surface area and thickness of the multilayer structure. The buildup of the stress can eventually lead to cracking of the multilayer structure, which makes it difficult to fabricate high-quality semiconductor devices.

Figure 1A:
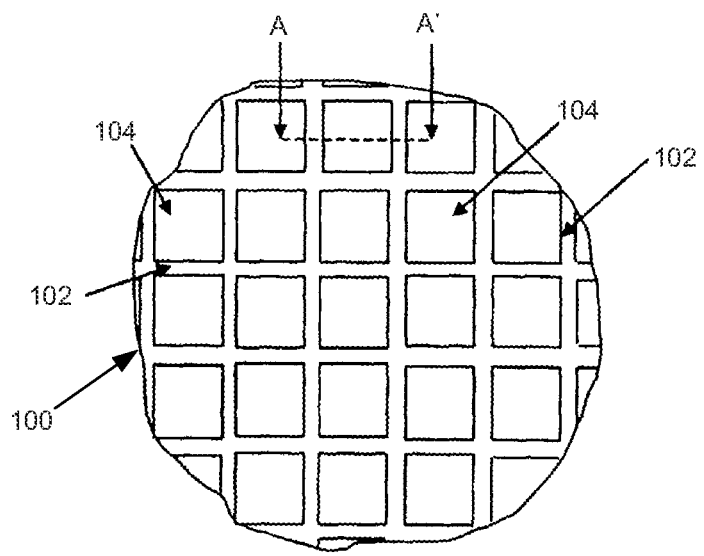
FIG. 1A illustrates a technique for stress relief during fabrication of multilayer structures on a substrate surface in accordance with one embodiment of the present invention.

FIG. 1A illustrates a technique for stress relief during fabrication of multilayer structures on a substrate surface in accordance with one embodiment of the present invention.

As seen in FIG. 1A, a partial region 100 of a substrate surface, such as a Si substrate, is patterned (for example, using a photolithography technique) and partitioned with an intersecting trench structure 102. Forming trench structure 102 can involve any now known or later developed techniques for making trenches on a substrate surface. These techniques can include, but is not limited to, dry etching techniques, wet etching techniques, and mechanical scraping techniques.

Trench structure 102 divides up partial substrate 100 into arrays of isolated square platforms 104, wherein each square platform is only a small portion of the original surface area. Typically, the size of each square platform is determined by the footprint of a single semiconductor device, such as an LED, or a diode laser. In one embodiment of the present invention, each platform has a dimension of approximately 100 µm to 3000 µm.

Note that other than forming square platforms, alternative platform geometries can be formed by changing the patterns of trenches structure 102. Some of these alternative geometries can include, but are not limited to: a triangle, a rectangle, a parallelogram, a hexagon, a circle, or other non-regular shapes.

Figure 1B:
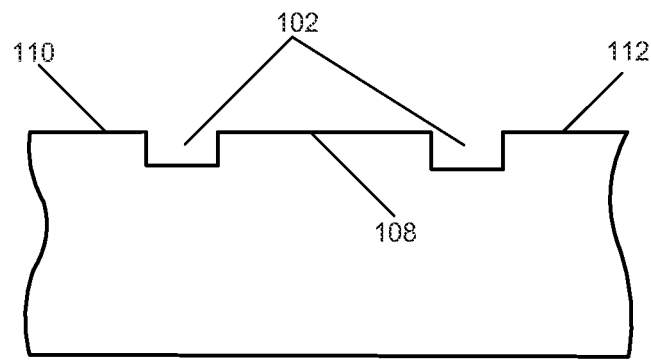
FIG. 1B illustrates a cross-sectional view of the trench-partitioned substrate along the horizontal line AA' in FIG. 1A in accordance with one embodiment of the present invention.

FIG. 1B illustrates a cross-sectional view of trench-partitioned substrate along a horizontal line AA' in FIG. 1A in accordance with one embodiment of the present invention. As seen in FIG. 1B, the sidewalls of intersecting trenches 102 effectively form the sidewalls of the isolated mesa structures, such as mesa 108, and partial mesas 110 and 112. Each mesa defines an independent surface area for growing a single semiconductor device.

Note that when depositing materials on these mesas, deposited material can also accumulate in trenches 102. If neighboring multilayer structures are to be connected with the material in the trench, stress in the multilayer structures can not be efficiently released. Hence, in one embodiment of the present invention, trench structure 102 is sufficiently deep so that multilayer structures formed on two adjacent mesas on each side of a trench are sufficiently uncoupled from each other.

For example, for a typical multilayer structure of 4 µm thick, the depth of the trench can be 4 µm. In one embodiment, the depth of trench 102 is greater than twice of the multilayer structure thickness.

Figure 1C:
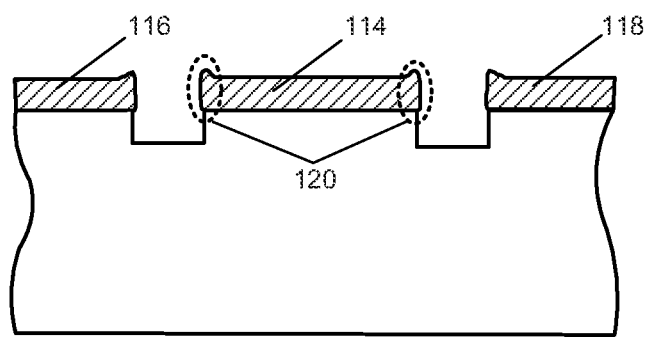
FIG. 1C illustrates the cross-sectional view of FIG. 1B after forming isolated multilayer structures.

FIG. 1C illustrates the cross-sectional view of FIG. 1B after forming isolated multilayer structures 114-118 in accordance with one embodiment of the present invention.

Note that multilayer structure 114 formed on mesa 108 is spatially uncoupled from adjacent multilayer structures 116 and 118, which are also spatially uncoupled from their respective neighboring structures. In one embodiment, each multilayer structure 114-118 corresponds to a single semiconductor device. Because the surface area of multilayer structure 114 is significantly smaller than partial substrate 100, stress in multilayer structure 114 due to the mismatch with the substrate is also significantly reduced. Hence, the problems resulted from large stress in a non-partitioned substrate surface are effectively eliminated by patterning a substrate with deep trenches and by forming individual semiconductor devices on isolated deposition platforms.

In one embodiment of the present invention, each multilayer structure is an $In_xGa_yAl_{1-x-y}N$ ($0 \leq x \leq 1$, $0 \leq y \leq 1$) based light emitting device. In the following discussion, a "GaN material" can generally include an $In_xGa_yAl_{1-x-y}N$ ($0 \leq x \leq 1$, $0 \leq y \leq 1$) based compound, which can be a binary, ternary, or quaternary compound, such as GaN, InGaN, GaAlN, and InGaAlN.

Figure 2:
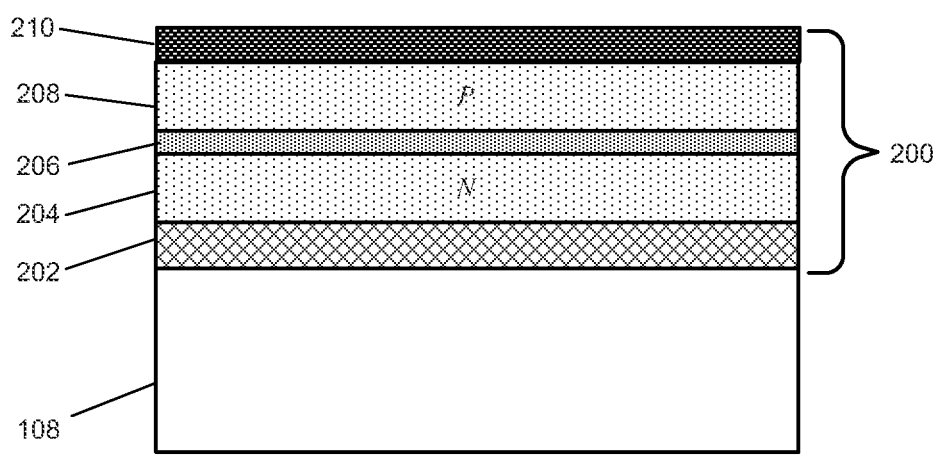
FIG. 2 illustrates an exemplary GaN-based LED structure which corresponds to the multilayer structure in accordance with one embodiment of the present invention.

FIG. 2 illustrates an exemplary GaN-based LED structure 200 which corresponds to multilayer structure 114 in accordance with one embodiment of the present invention. GaN LED 200 has an optional buffer layer 202, which is epitaxially grown on Si mesa 108 for lattice-constant and/or thermal-expansion coefficient matching purposes. An n-type doped GaN layer 204 is then grown on buffer layer 202. Next, an InGaN/GaN multi-quantum-well (MQW) active layer 206 and a p-type doped GaN layer 208 are formed on n-type doped layer 204.

Subsequently, an Ohmic-contact layer 210 is formed on p-type doped layer 208. Formation of Ohmic-contact layer 210 can use any chemical or physical vapor deposition method, such as electron-beam evaporation, filament evaporation, or sputter deposition. Ohmic-contact layer 210 can also be a reflective material with a reflectivity not less than 30%.

Referring back to FIG. 1C, note that growing multilayer structure 114 on mesa 108 is subject to "boundary effect." More specifically, when depositing a layer in the multilayer structure, the deposition rate is more uniform in the central region of the platform but tends to increase towards the boundaries of the platform.

This boundary effect is a result of an increasing number of defects and roughness near the boundaries, which create more growth sites for the material being deposited. Consequently, the formed layer is more uniform in the middle region but might become thicker and contain more defects towards the boundaries of the platform. When a newly deposited layer becomes the deposition surface for the next layer, such asperity of the boundaries further aggravates the boundary effect for the growth of the next layer. As a result, multilayer structure 114 is uniform in the middle region but grows thicker and/or irregular (inside circles 120) at the boundaries of mesa 108. Note that under some conditions, structure 114 might not form thicker regions 120 at the boundary of mesa 108. Nevertheless, prominent growth defects can still be present and significantly reduce device performance. Although the examples presented in this disclosure illustrate these thicker regions, such thicker regions are for illustration purposes only and do not limit embodiments of the present invention to such conditions.

Furthermore, outgrown multilayer structure can also form horizontally and wrap over the sidewalls of mesa 108. As a result, multilayer structure 114 can curve over the boundaries and grow in the horizontal direction on the sidewalls of mesa 108.

Eventually, an as-fabricated multilayer device 114 can have a highly uneven boundaries and outgrown sidewalls. If such a device is an LED device, the low-quality sidewalls can lead to significantly increase in leakage current, and a deteriorating electrostatic discharge (ESD) resistance.

It is therefore desirable to remove low-quality boundary regions 120 of multilayer structure 114.

Removing Low-Quality Boundaries from the Topside

Figure 3A:
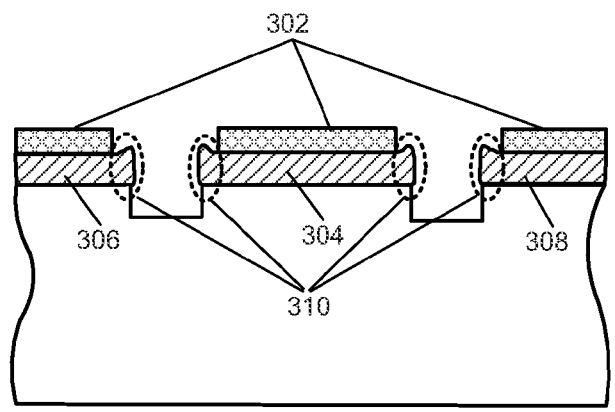
FIG. 3A illustrates the step of patterning an etch mask layer on each multilayer structure in accordance with one embodiment of the present invention.
Figure 3B:
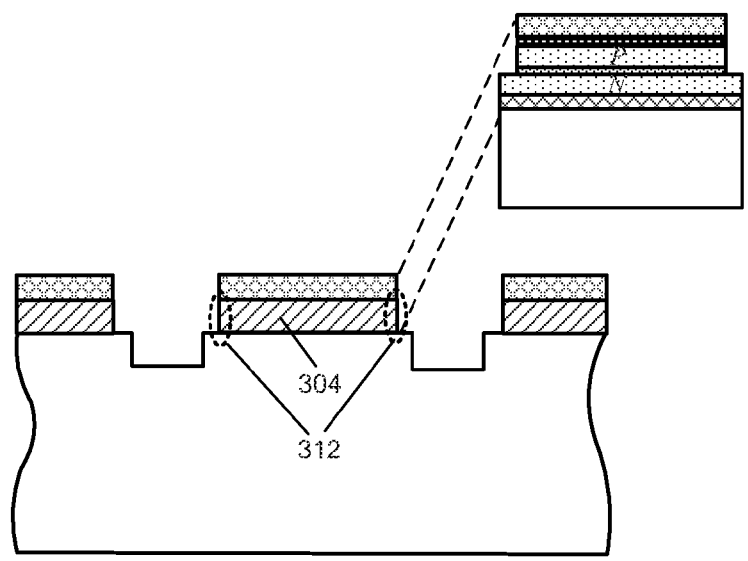
FIG. 3B illustrates the resulting multilayer structures after removing the low-quality boundaries of the multilayer structures in accordance with one embodiment of the present invention.
Figure 3C:
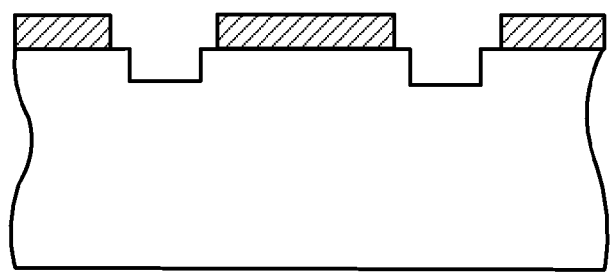
FIG. 3C illustrates the final multilayer structures after mask layer liftoff in accordance with one embodiment of the present invention.

FIGS. 3A-3C illustrate a process of removing low-quality boundaries of an multilayer structure in accordance with one embodiment of the present invention.

FIG. 3A illustrates the step of patterning an etch mask layer on each multilayer structure in accordance with one embodiment of the present invention. As shown in FIG. 3A, etch mask layer 302 of predetermined thickness is patterned over each multilayer structures 304, 306 (partially shown), and 308 (partially shown). On each multilayer structure, etch mask 302 is designed to protect the high-quality region of the multilayer structure while exposing the low-quality boundary regions 310 of the multilayer structure. Note that mask layer 302 is selective to withstand subsequent etching process, and therefore is chosen based on the type of etching process. The predetermined thickness of mask layer 302 is sufficiently thick to protect the high-quality regions through the etching process. In one embodiment, mask layer 302 has a thickness between 5 μm and 10 μm.

In one embodiment of the present invention, the etching process is an inductively coupled plasma (ICP) dry etching process and etch mask layer 302 is made of silicon oxide ($SiO_2$). In this embodiment, a $SiO_2$ layer of predetermined thickness is deposited over the multilayer structure surfaces. Next, a photo-resist (PR) layer is spin-coated over the $SiO_2$ layer. This PR layer is then patterned and a PR mask similar to etch mask 302 is obtained. Next, using the patterned PR layer as a mask, the $SiO_2$ layer is patterned and the PR layer is subsequently removed. The $SiO_2$ mask is then used to protect the high-quality regions of multilayer structures in the subsequent ICP process.

FIG. 3B illustrates the resulting multilayer structures after removing low-quality boundaries 310 of the multilayer structures in accordance with one embodiment of the present invention. As is observed, new boundaries 312 of multilayer structure 304 are substantially defined by the boundaries of mask layer 302. Low-quality regions 310 and outgrown structure on the sidewalls of growth mesa of multilayer structure 302 are etched away.

Removing low-quality regions 310 can be implemented by using dry etching, wet etching, or a combined dry etching/wet etching process. Note that a dry etching process is typically anisotropic and the resulting sidewalls of multilayer structure 314 are substantially vertical (as shown in FIG. 2B). On the other hand, if a wet etching process is used, the etching process is typically isotropic, and the resulting sidewalls of multilayer structure 314 may be undercut to a certain distance under mask layer 302. However, a wet etching process typically has a higher etch rate than using a dry etching process.

Note that when etching a GaN LED structure as is shown in FIG. 2, the etching process may not need to completely go through multilayer stack 200. In one embodiment, the etching process only needs to etch through p-type layer 208 and active layer 206, while n-type layer 204 and buffer layer 202 are not etched. The inset of FIG. 3B illustrates such a partially etched GaN LED structure.

FIG. 3C illustrates the final multilayer structures after mask layer 302 is liftoff in accordance with one embodiment of the present invention. The new boundaries of multilayer structures are high-quality boundaries free of defects and hence are not susceptible to leakage current or ESD problems.

In one embodiment of the present invention, the above described etching process is followed by depositing an insulating layer over the structures wherein the insulation layer also covers the sidewalls of the multilayer structures. Note that such an insulating layer can help protecting the sidewalls of the multilayer structures from being shorted by subsequent metal deposition processes, such as to form electrodes for the multilayer structures.

EXAMPLE 1

A conventional substrate is patterned and etched to form square individual deposition platforms. Each square deposition platform has a size of 285 μm×285 μm. The trench structure that partitioned the substrate has a trench width of 15 μm and depth of 20 μm.

Next, on each square deposition platform, a GaN blue LED multilayer structure is formed by epitaxial growth using an metal oxide chemical vapor deposition (MOCVD) method, wherein the total thickness of the multilayer structure is 4 μm. An oxide mask layer is then deposited and a 2 μm thick PR layer is then spin-coated over the mask layer, wherein the PR layer is photolithographed to retain the 250 μm×250 μm central region. The oxide layer is then etched through a photo lithography process to expose ~35 μm wide boundaries on each side of the multilayer structure.

The substrate then under goes an ICP dry etching process. The dry etching process removes the exposed low-quality edges and sidewalls of the multilayer structure, hence obtaining high-quality boundaries for the multilayer structure.

EXAMPLE 2

A conventional substrate is patterned and etched to form diamond-shape individual deposition platforms. Each diamond-shaped deposition platform has a side of 285 μm and an acute angle of 60°. The trench structure that partitioned the substrate has a trench width of 15 μm and depth of 30 μm.

Next, on each diamond-shaped deposition platform, a GaN blue LED multilayer structure is formed by epitaxial growth using an MOCVD method, wherein the total thickness of the multilayer structure is 4 μm. A 6 μm thick PR layer is then spin-coated over the multilayer structure, wherein the PR layer is photo lithographed to retain a 250 μm-side diamond shape, which subsequently exposes approximately 35 μm wide boundaries on each side of the multilayer structure.

The substrate is then placed in an ICP machine, and is dry-etched until the active layer of the LED multilayer structure is etched through. The dry etch process removes the exposed low-quality edges and sidewalls of the multilayer structure, hence obtaining high-quality boundaries for the multilayer structure.
Removing Low-Quality Boundaries from the Underside In one embodiment of the present invention, removing low-quality boundaries 120 in FIG. 1C is performed from the underside of multilayer structure 114. This technique is typically incorporated into a "flip-chip" style wafer bonding process and involves more steps than the topside etching process of FIG. 3.

Figure 4:
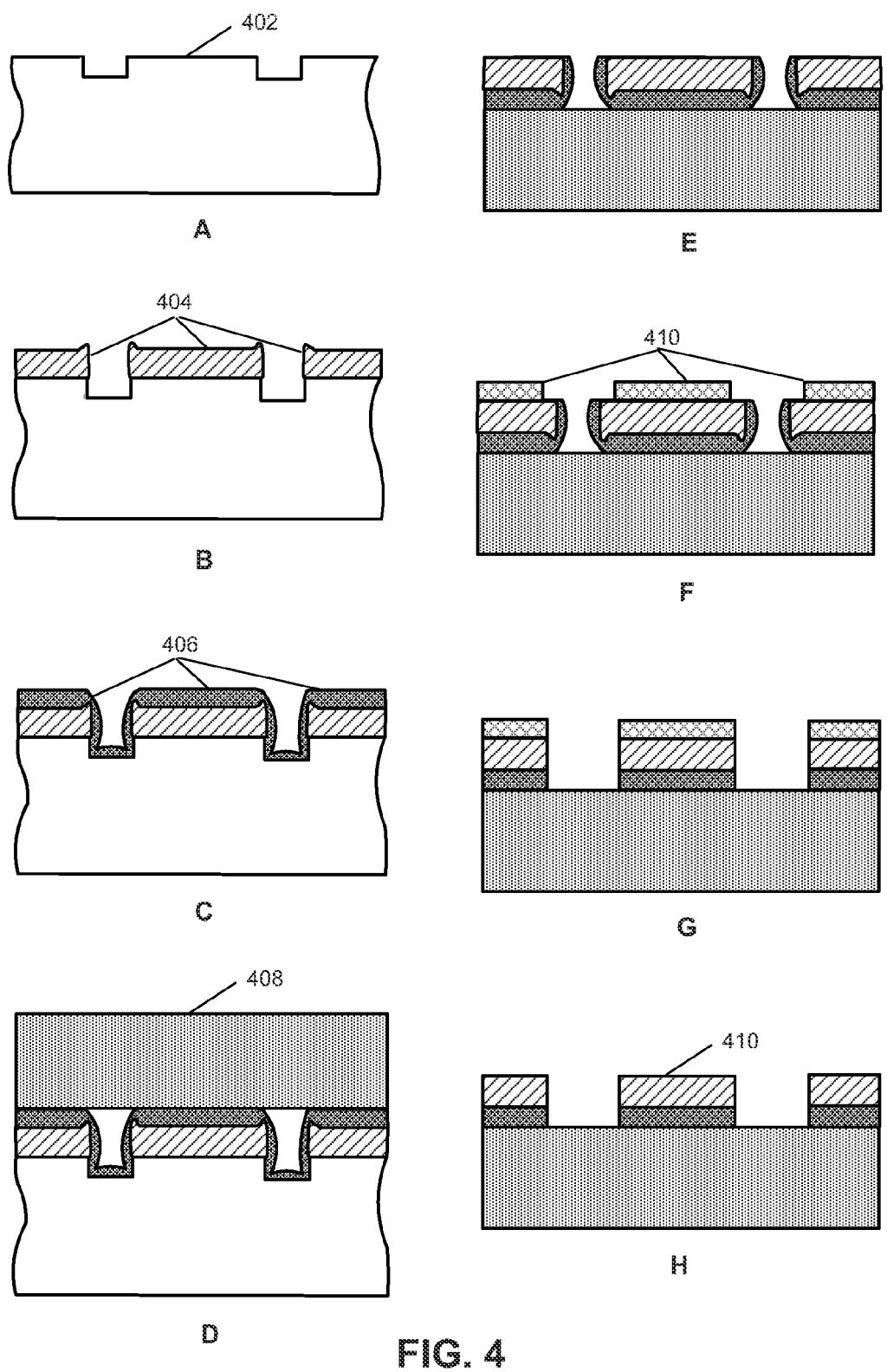
FIG. 4 illustrates an exemplary step-by-step process of boundary removal from the underside of the multilayer structure in accordance with one embodiment of the present invention.

FIG. 4 illustrates an exemplary step-by-step process of boundary removal from the underside of the multilayer structure in accordance with one embodiment of the present invention.

In Step A, a silicon substrate 402 is patterned and etched to produce a number of mesas separated by trenches. Each mesa defines the surface area for growing a multilayer structure.

In Step B, multilayer structures 404 are formed above the substrate mesas. Note that in one embodiment, the mesas are sufficiently apart and the trenches are sufficiently deep so that the epitaxial growth of different layers does not create any attachment between two individual structures, thereby significantly reducing the stress associated with lattice-mismatched growth. In one embodiment of the present invention, multilayer structures 404 are GaN-based semiconductor structure 200. Note that as-deposited multilayer structures 404 have low-quality boundaries due to the boundary effect.

In Step C, a gold bonding-layer 406 is deposited above multilayer structures 404. Note that gold layer 406 may partially fill the trenches between multilayer structures 404 and also form on the sidewalls of the mesas. Because bonding-layer metal can deposit on the sidewalls and short the P-N junctions, one embodiment of the present invention optionally forms an insulating layer over multilayer structure 404 prior to depositing metal bonding-layer 406. Note that other metals suitable as a bonding material can also be used.

In Step D, support-structure 408 is attached and adhered to gold bonding-layer 406. In one embodiment, support-structure 408 is a new silicon substrate.

In Step E, silicon deposition substrate 402 is removed using a wet etching process. As a result of removing silicon deposition substrate 402, the underside of multilayer structures 404 is exposed. Note that the entire structure has been flipped over in Step E and multilayer structures 404 are supported by gold bonding-layer 406 and support-structure 408.

In Step F, each multilayer structure is patterned with a mask layer 410, which protects the high-quality region of each multilayer structure while exposing the low-quality region around the structure boundaries, and also exposing the bonding layer on the sidewalls. In one embodiment, mask layer 410 is a photo-lithographed PR mask layer. In a further embodiment, mask layer 410 can be a photo-lithographed metal mask layer which also serves as an Ohmic-contact layer to the LED multi-layer structure. In a further embodiment, mask layer 410 is a photo-lithographed metal layer as described above except that the PR mask used in patterning the metal layer is retained over the patterned metal layer. Hence, mask layer 410 includes both the metal layer and the PR layer to provide more etch protection.

In Step G, low-quality boundaries and sidewalls (including the bonding material on the sidewalls) of multilayer structures are removed using an etching process.

In one embodiment, the etching process is a wet etching process using a $H_3PO_4$ acid bath. Note that GaN (or more generally InGaAlN) thin films typically exhibit a hexagonal Wurtzite crystalline structure with a preferred stable growth surface in the (0001) direction. Hence, the GaN crystal exhibits a Ga-polarity in the growth direction, which points from the n-type doped layer to the p-doped layer. As a result, the removal of the original growth substrates exposes a surface that exhibits a N-polarity. A significant benefit of using $H_3PO_4$ based wet etching is that the etchant reacts at a high rate with the N-polarity surface of the multi-layer structure, thereby significantly increasing the production speed. Furthermore, the etch rate of the $H_3PO_4$-acid based etchant can be controlled by heating the etchant to a predetermined temperature, wherein a higher temperature corresponds to a higher etching rate. In one embodiment, the temperature of the $H_3PO_4$-acid bath is higher than 100° C. In a further embodiment, the temperature of $H_3PO_4$-acid bath is at 150° C. The etching mask suitable for the $H_3PO_4$ wet etching process includes a PR mask, a metal mask, or a PR/metal dual-layer mask. Note that the $H_3PO_4$ based wet etching can be much slower when applied to a Ga-polarity surface of the multi-layer structure due to the different properties of the two polarities of a GaN crystal. Therefore, the $H_3PO_4$ based wet etching is particularly suitable for removing the low-quality regions from the underside of the structure after the flip-chip process.

In a further embodiment, the etching process is a dry etch process, such as an ICP etching process. Note that a dry etching process is typically anisotropic and perpendicular to the multilayer structure. Hence, the resulting sidewalls of multilayer structure 404 are substantially straight. Note that when the dry etching process is applied to the GaN based multilayer structure of FIG. 2, the etching process may not need to completely go through stack 200. In one embodiment, the etching process only needs to etch through buffer layer 202, n-type layer 204 and active layer 206 while p-type layer 208 is not etched, because the structure has been reversed due to the flip-chip process.

Finally, in Step H, mask layer 410 is lifted off etched multilayer structure 404, wherein the new boundaries of multilayer structure 404 are high-quality boundaries not susceptible to leakage current or ESD problems. Note that after Step H, an optional deposition step can be performed to coat the multilayer structures, including the sidewalls, with an insulating material. This provides a protection against shorting or contamination on the sidewalls of individual P—N junction structure.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for obtaining high-quality boundaries for individual multilayer structures which are fabricated on a trench-partitioned substrate, comprising:
   receiving a trench-partitioned substrate wherein the substrate surface is partitioned into arrays of isolated deposition platforms which are separated by arrays of trenches;
   forming a multilayer structure, which comprises a first doped layer, an active layer, and a second doped layer, on one of the deposition platforms; and
   removing sidewalls of the multilayer structure, wherein removing the sidewalls of the multilayer structure involves an etching process, wherein the etching process is performed from the underside of the multiple structures, and wherein the method further comprises:
   bonding a supporting structure to the topside of the multiple structures;
   removing the trench-partitioned substrate to expose the underside of the multiple structures, wherein the multilayer structures are attached to the supporting structure;
   patterning the underside of the multiple structures to expose undesirable boundary regions of the multiple structures; and
   removing the sidewalls of the multiple structures corresponding to the undesirable boundary region.

2. The method of claim 1, wherein the etching process includes at least one of the following process:
   a dry etching process;
   a wet etching process; and
   a combined dry etching and wet etching process.

3. The method of claim 2, wherein prior to etching the sidewalls, the method further comprises protecting non-boundary surface of the multilayer structure with a mask layer, thereby only exposing the boundary region of the multilayer structure to the subsequent etching process.

4. The method of claim 3, wherein the exposed boundary width is between 2 µm and 50 µm.

5. The method of claim 2, wherein if a dry etching process is used, the method further comprises controlling the dry etching process to at least etch through the active layer of the multilayer structure, wherein the dry etching process is directed perpendicular to the multilayer structure.

6. The method of claim 2, wherein the dry etching process is an inductively coupled plasma (ICP) etching.

7. The method of claim 2, wherein the wet etching process involves using a $H_3PO_4$ based etchant.

8. The method of claim 7, wherein the method comprises heating the $H_3PO_4$ based etchant to a temperature greater than 100° C.

9. The method of claim 1, wherein removing the sidewalls of the multiple structures involves using a $H_3PO_4$ based etchant to wet-etch the sidewalls.

10. The method of claim 9, wherein the method comprises heating the $H_3PO_4$ based etchant to a temperature greater than 100° C.

* * * * *